(12) United States Patent
Hofmann et al.

(10) Patent No.: US 8,766,631 B2
(45) Date of Patent: Jul. 1, 2014

(54) NMR MEASUREMENT APPARATUS WITH FLOW-THROUGH PROBEHEAD

(75) Inventors: Martin Hofmann, Rheinstetten (DE); Simon Benedict Duckett, Heslington/York (GB); Antonio Gianotti, Heidelberg (DE); Gary George Reginald Green, Benton (GB)

(73) Assignees: Bruker BioSpin GmbH, Rheinstetten (DE); The University of York, Heslington, York (GB)

( * ) Notice: Subject to any disclaimer, the term of this patent is extended or adjusted under 35 U.S.C. 154(b) by 445 days.

(21) Appl. No.: 12/998,713

(22) PCT Filed: Nov. 27, 2009

(86) PCT No.: PCT/EP2009/008458
§ 371 (c)(1),
(2), (4) Date: Aug. 5, 2011

(87) PCT Pub. No.: WO2010/060631
PCT Pub. Date: Jun. 3, 2010

(65) Prior Publication Data
US 2011/0285396 A1 Nov. 24, 2011

(30) Foreign Application Priority Data
Nov. 27, 2008 (DE) .......................... 10 2008 059 313

(51) Int. Cl.
*G01V 3/00* (2006.01)
(52) U.S. Cl.
USPC ........................................................ 324/307
(58) Field of Classification Search
USPC ................................................ 324/300–322
See application file for complete search history.

(56) References Cited

U.S. PATENT DOCUMENTS

| 5,705,928 | A | * | 1/1998 | Haner et al. ................. 324/321 |
| 6,079,213 | A | | 6/2000 | Driehuys |

(Continued)

FOREIGN PATENT DOCUMENTS

EP 1 860 452 11/2007

OTHER PUBLICATIONS

Louis-S. Bouchard et al., "Para-Hydrogen-Enhanced Hyperpolarized Gas-Phase Magnetic Resonance Imaging", Angew. Chem. Int. Ed. 2007. 46. 4064-4068.

(Continued)

*Primary Examiner* — Dixomara Vargas
(74) *Attorney, Agent, or Firm* — Paul Vincent

(57) ABSTRACT

The invention relates to a device (1, 21, 31, 41, 64) for the preparation and measurement of a nuclear spin resonance (NMR) measurement sample (10), including—a flow-through NMR probehead (2), with a first tube (3) and a second tube (14) each for the supply and removal of a liquid NMR measurement sample (10),—at least one chamber (4, 22, 32) which is connected to one of the tubes (3, 14),—a sample inlet (5) for introducing the liquid measurement sample (10) into the device (1, 21, 31, 41, 64), wherein at least one chamber (4, 22, 32) has at least one connection for increasing (9, 24, 25, 42, 43, 46, 47) and releasing (8, 23, 27, 48a, 48b) the gas pressure, and in which at least one chamber (4, 22, 32) comprises means for mixing the liquid measurement sample (10) contained in the chamber (4, 22, 32) with a gas With the inventive device it is possible to reduce the measurement sample consumption when doing an NMR spectroscopic measurement on liquid measurement samples to which spin order can be catalytically transferred.

9 Claims, 12 Drawing Sheets

(56) References Cited

U.S. PATENT DOCUMENTS

| | | | |
|---|---|---|---|
| 6,295,834 B1 * | 10/2001 | Driehuys | 62/637 |
| 6,380,737 B1 | 4/2002 | Myles | |
| 6,430,960 B1 * | 8/2002 | Driehuys | 62/637 |
| 6,484,532 B2 * | 11/2002 | Driehuys | 62/637 |
| 6,574,495 B1 | 6/2003 | Golman | |
| 8,497,683 B2 * | 7/2013 | Trygstad et al. | 324/321 |
| 2004/0024307 A1 | 2/2004 | Golman | |
| 2005/0245815 A1 | 11/2005 | Hersman | |
| 2007/0241752 A1 | 10/2007 | Meersmann | |
| 2007/0266779 A1 | 11/2007 | Hofmann | |
| 2008/0011108 A1 | 1/2008 | Hofmann | |
| 2008/0240998 A1 | 10/2008 | Urbahn | |
| 2010/0219826 A1 | 9/2010 | Duckett | |

OTHER PUBLICATIONS

R.E. Jacob et al., "$^3$He spin Exchange cells for magnetic resonance imaging", Journal of Applied Physics, vol. 92, No. 3, 1588.

* cited by examiner

US 8,766,631 B2

NMR MEASUREMENT APPARATUS WITH FLOW-THROUGH PROBEHEAD

This application is the national stage of PCT/EP2009/008458 filed on Nov. 27, 2009 and also claims Paris Convention priority of DE 10 2008 059 313.3 filed on Nov. 27, 2008.

BACKGROUND OF THE INVENTION

The invention relates to a device for the preparation and measurement of a nuclear spin resonance (NMR) measurement sample, including a flow-through NMR probehead.

Nuclear spin resonance (NMR) spectroscopy is an instrumental analytical technique by which the chemical composition of measurement samples can be determined. For this, the measurement sample, which is held in a strong, static magnetic field, is subjected to high frequency (HF) pulses and the electromagnetic reaction of the sample is measured.

Liquid measurement samples are usually introduced into NMR sample tubes, and the loaded tube is transferred to the measurement location in the NMR spectrometer, mostly by the use of an automatic (e.g. pneumatic) transport apparatus. After the measurement the sample tube is removed.

Alternatively, it is possible to transport a liquid measurement sample through a system of tubes into a so-called flow-through NMR probehead. In the flow-through NMR probehead is a measurement cell, typically of larger diameter than the supply and removal tubes. The liquid measurement sample is taken from a supply volume and pumped through the tube system, usually using a transport liquid which pushes the liquid measurement sample through the tube system. After the measurement, the sample is transported out of the measurement cell. Flow-through cells for an NMR spectrometer are described, for example, in DE 10 2006 029 496 A1; a device for the transport of a liquid sample for a flow-through NMR measurement is known from DE 10 2006 023 223 B3. The measurement of liquid NMR samples using the flow-through procedure simplifies the automatic transport of the sample to the measurement location.

After measurement in accordance with the flow-through procedure, the liquid measurement sample is removed. To do this, a transport liquid (and/or the next liquid measurement sample) is pumped into the measurement cell through a tube, and the measured sample is washed out from the measurement cell through another tube and directed to an outlet. A disadvantage of this method is that after the measurement the sample is used up.

It is known from the state of the art that the signal obtained from NMR experiments can be enhanced by using a preparation of the sample, known as para-hydrogen induced polarisation (PHIP). WO 99/24080 describes a PHIP process in which para-hydrogen ($pH_2$) is added to a symmetrical carbon-carbon double bond containing a $^{13}C$ nucleus, during which spin $pH_2$ order is transferred from $pH_2$ to the $^{13}C$ nucleus. Because the chemical structure of the measurement substance is changed by the addition of $pH_2$, this preparation can only take place once, and, accordingly, the measurement substance is discarded after the measurement.

The post-published international patent application PCT/EP2008/004865 describes the development of a procedure by which non-equilibrium spin order from a symmetrical molecule, particularly para-hydrogen, can be transferred using simple activation measures to the hyperpolarisable nucleus of a measurement substance (compound) with the help of a template (catalyst) with sites of ordered environment, particularly a metal complex. The activation method can include, for example, the mechanical mixing of the symmetrical molecule, measurement substance and template, or the application of an alternating magnetic field to the same substances. The catalytic transfer of spin order does not change the chemical structure of the measurement substance. NMR experiments with an improved signal-to-noise ratio can be performed on the hyperpolarised nucleus.

After the activation measures, however, the spin order transferred to the measurement substance quickly decays, so that signal strength is lost even while the measurement sample is transferred to the spectrometer. Additionally, the spin order will be used up during subsequent NMR experiments, meaning that each sample can only be measured once after activation.

By measuring activated liquid measurement samples in the flow-through operation, the time between activation of the measurement sample and the beginning of the NMR measurements can be reduced, and thus more signal can be received. A measurement sample which has lost its transferred spin order as a result of an NMR experiment can also be quickly replaced by a fresh measurement sample, so that through fast, repeated NMR measurements the signal-to-noise ratio can be improved.

However, this fast replacement of the measurement sample in such a flow-through operation means that a large amount of liquid measurement sample is used up, which makes such an action rather expensive.

The object of the invention is to reduce the measurement sample consumption when doing an NMR spectroscopic measurement on liquid measurement samples to which spin order can be catalytically transferred, particularly in the manner described in PCT/EP2008/004865.

SUMMARY OF THE INVENTION

This object is achieved by a device for the preparation and measurement of a nuclear spin resonance (NMR) measurement sample, including:
 a flow-through NMR probehead, with a first tube and a second tube each for the supply and removal of a liquid NMR measurement sample,
 at least one chamber which is connected to one of the tubes,
 a sample inlet for introducing the liquid measurement sample into the device,
wherein at least one chamber has at least one connection for increasing and releasing the gas pressure,
and in which at least one chamber comprises means for mixing the liquid measurement sample contained in the chamber with a gas.

The inventive device allows the simple re-use and fast reactivation of a measurement substance in a liquid measurement sample, where spin order can be transferred catalytically to the measurement sample from a gas when the measurement substance has lost this transferred spin order through an NMR experiment.

The invented device has at its disposal at least one chamber in which the catalytic transfer of non-equilibrium spin order from a symmetrical molecule, which is present as a gas or a part of a gas mixture, to a hyperpolarisable nucleus of the measurement substance can take place. The measurement substance is present as a liquid or as part of a liquid solution ('liquid measurement sample'). The liquid measurement sample can undergo mixing in the chamber with the gas containing the symmetrical molecule ('reaction gas'), in order to prepare for the transfer of spin order (or, in individual cases, to bring this about). Suitable means of mixing are, for example, a stirrer, or a gas inlet opening into the lower region of the chamber. Additionally, the chamber can be equipped with devices for optimizing the spin transfer and selecting a preferred spin state ('activation means'), for instance, alternating magnetic field generators. The template (catalyst, medium that facilitates the transfer of polarization) is also present in the chamber; it can be dissolved in the liquid measurement sample or can be put in place in the chamber as a solid. The choice of gas containing the symmetrical molecules, of template and of measurement substance, as well as the procedure for transferring spin order, can take place as described in PCT/EP2008/004865, the disclosures of which are included in the present description.

By increasing and releasing the gas pressure via at least one corresponding connection, reaction gas can be inserted into the chamber and provided for an interaction with the measurement sample, and used or excessive reaction gas can be removed again. Note that there may be a first connection for increasing the gas pressure and a second connection for releasing the gas pressure, or a common connection for both increasing and releasing the gas pressure. The transport of the liquid measurement sample can be done by means of a pump provided for this purpose, or by increasing and releasing the gas pressure.

By the use of excess pressure in the chamber, the liquid measurement sample can be transported into the flow-through NMR probehead. Once the measurement is complete, the liquid measurement sample can be transported back into the chamber by use of a relative under-pressure in the chamber. For simple designs in particular, the increase and release of gas pressure in the chamber can take place via (through) the probehead, i.e. through the first tube and/or the second tube. In a multi-chamber system, on the other hand, the increase and release of gas pressure is usually achieved directly in one chamber (without including the probehead).

The increase and release of gas pressure according to the invention is achieved by one or more connections leading directly or indirectly into the chamber. Gas pressure increase is typically achieved by opening a connection to a pressurised gas source (e.g. a pressurised gas bottle or a local pressurised gas supply in a laboratory) at high pressure (>1 bar, usually 1.5 bar or more); gas pressure release is typically achieved by opening a connection to the surroundings (with air pressure of approx. 1 bar), ideally inside a fume cupboard.

The invented device allows thereby the movement of the liquid measurement sample back and forth between at least one chamber and the probehead, in particular to allow the reactivation of the measurement substance in the chamber in the meantime. If more than one chamber is present, the liquid measurement sample can also move back and forth from chamber to chamber, especially through the probehead, which is connected in between two of the chambers. Reactivation can then take place in one or both chambers.

In the reactivation, the same measurement substance which has lost the non-equilibrium spin order transferred to it can once again receive a non-equilibrium spin order. The measurement substance is thus not used up but is recycled; in particular, the measurement substance does not need to be discarded. For the reactivation of the measurement substance, more symmetrical-molecule-containing gas can, if necessary, be added to the mixture, or gas which is present in the chamber or dissolved in the measurement sample and which has not transferred its non-equilibrium spin order can be used up.

Note that, to increase the gas pressure for the purposes of sample transport, another gas (in particular an inert gas) can be used, other than that used for the spin transfer. In this case, typically two connections to the chamber for increasing the gas pressure are provided, one for the transport gas (often nitrogen, argon or another noble gas, or a mixture of these) and one for the spin-transfer gas (mostly para-hydrogen). The connections for increasing the pressure of the transport and reaction gases typically flow into different chambers.

The invented device allows a clear reduction in the consumption of measurement sample because it (the sample) can be transported backwards and forwards and can therefore be activated and measured more than once.

In a preferred embodiment of the invention, two chambers are provided, wherein a first chamber is connected to the first tube and a second chamber is connected to the second tube. The liquid measurement sample can move between the two chambers. After the sample has been activated in one of the chambers, it can, depending on the amount of sample available (and with a sufficiently long spin relaxation time), be transported to the probehead (where it is measured) and then to the second chamber in multiple steps, without the need to reactivate the remaining measurement sample. The second chamber can likewise be used for the activation of the liquid measurement sample, thus avoiding the need to pump material around. The second chamber can also act as a pressurised container, in order to simplify the transport (and particularly the return transport) of the measurement sample using pressurised gas.

Especially preferable is a further development of this embodiment in which the first and second chambers each have a connection for increasing and releasing the gas pressure. In this way, the transport of the measurement sample between the chambers is simplified, and, in particular, it becomes unnecessary for either of the chambers to act as pressurised containers and conserve gas pressure, for instance during NMR measurements.

In another preferred further development, the first and second chambers are linked together by a gas pressure equalisation tube, which contains a switchable valve. This gas pressure equalisation tube with valve simplifies the manipulation of the device. In individual cases, the number of connections for increasing and releasing the gas pressure, or the consumption of pressurised gas, can be reduced by the gas pressure tube.

Another advantageous embodiment provides that the device comprises a pump by means of which the liquid measurement sample can be transported at least from a chamber into the flow-through NMR probehead. In this case, increasing and releasing the gas pressure, in particular with a reaction gas such as para-hydrogen, can be done independently of the transport of the liquid measurement sample.

In a preferred further development of this embodiment, the first tube and the second tube flow into the same chamber such that a measurement sample loop is formed, wherein one of the tubes contains the pump. Because of the establishment of the loop for the measurement sample, transporting the liquid measurement sample in one direction is sufficient to transport the liquid measurement sample from the chamber into the probehead and back. The loop also allows a continuous operation of the device (in particular with a continuous reactivation of the measurement sample and a continuous measurement in the probehead).

In one preferred embodiment, a valve means is provided, which in its closed position interrupts the first tube and the second tube. In this way, stable conditions for the NMR measurement in the probehead can be reached.

A further development of this embodiment provides that the first tube and the and second tube make a short circuit with each other on the probehead side when the valve means is in the closed position. This allows a single valve (for instance, a four-port, two-position turning valve linking two neighbouring ports respectively) to shut off the first and second tubes, thereby isolating the probehead for the NMR measurement.

Alternatively, or additionally, a further development is provided wherein the first and second tubes make a short circuit with each other on the chamber side when the valve means is in the closed position. The first and second tubes can thus be used as a pressure equalisation tube; a connection (or connections) for increasing and releasing the gas pressure installed in the region of the second tube can then also be used for the chamber connected to the first tube.

Especially preferable is an embodiment in which the first tube and/or the second tube comprises a liquid sensor, particularly in the region of the entrance to, or inside, the probehead. This is a simple way to determine when the probehead is sufficiently full (or completely empty). This allows the economical handling of the liquid measurement sample and also means that measurement conditions can be quickly and reliably adjusted.

Especially preferable is an embodiment in which a connection for increasing the gas pressure is connected to a reservoir of para-hydrogen. Para-hydrogen is a comparatively cheap and experimentally tested source of non-equilibrium spin order from a symmetrical molecule, which is to be transferred catalytically to hyperpolarisable nuclei in the measurement substance. Note that para-hydrogen can also be used as a transport gas. The nuclear spin order in para-hydrogen remains stable over many months, making it suitable for practical use.

Also preferable is an embodiment in which at least the inner surfaces of the tubes and of the at least one chamber consist of non-metallic material.

An advantageous embodiment provides that a connection for increasing the gas pressure of one chamber flows into the lower part of this chamber and comprises a frit. This allows gas—particularly para-hydrogen—to be bubbled in, so that it can mix well with the liquid measurement sample above it. Ideally the connection also has a one-way valve to prevent the liquid measurement sample from entering the gas tube.

Also especially preferable is an embodiment in which at least one chamber contains a template which provides the two protons of para-hydrogen with an ordered environment which allows the chemical or magnetic differentiation of both protons. The template (catalyst, polarization transfer medium) can thus ensure the spin order transfer from para-hydrogen to the hyperpolarisable nuclei of the measurement substance. In the simplest case, the template is a solid present in the chamber (in particular, zeolite spheres, or a coating on the inner surface of the chamber). The template can also be dissolved in the liquid measurement sample or be the liquid itself. Note that the choice of a suitable template can depend on the substance upon which the measurement will be made.

In a preferred further development, the template contains a metal complex, particularly a platinum group metal, or iridium complex, or a zeolite. These templates have shown themselves to be effective in experiments.

Especially preferable is an embodiment in which at least one chamber is equipped with a facility for the generation of a controlled magnetic field, in particular an alternating magnetic field, inside the chamber. A controlled magnetic field is capable of assisting the transfer of non-equilibrium spin order from the symmetrical molecule (for instance, para-hydrogen) to the hyperpolarisable nucleus of the measurement substance. The facility itself, as a rule, is located outside the chamber. In particular, the facility can include movable permanent magnets, or coils charged with alternating current.

Another preferable further development of this embodiment is that the magnetic field in the chamber generated and controlled by the facility is spatially inhomogeneous, in particular wherein the controlled magnetic field comprises field strengths in the range of between 0.2 µT and 0.1 T or a sub-range thereof. Gradients in the alternating field are an additional means of improving the spin transfer.

In another further development of the above embodiment, the magnetic field generated and controlled by the facility comprises an alternating field with a frequency of between 10 mHz and 10 kHz, in particular between 1 Hz and 1 kHz. This frequency range has hitherto been shown to be effective in experiments.

In a further preferred embodiment, at least one of the chambers is provided with a shaking device. By shaking (repeated back-and-forth swinging) of the chamber and its contents, not only is the mixing of the liquid measurement sample with the gas improved, but the spin order transfer is also improved. This is particularly valid when the shaking takes place in an inhomogeneous background magnetic field.

Method for Performing an NMR Experiment Using Said Device

Within the scope of the presented invention is also a method for carrying out an NMR experiment with enhanced sensitivity on a compound comprising hyperpolarizable nuclei, using the device according to the invention, comprising the following steps:

a) preparing a fluid having a temperature TF, containing spacially symmetric molecules comprising two halves each, with a non-Boltzmann nuclear spin state distribution of the symmetric molecules at this temperature TF, b) providing a compound with a defined chemical identity, c) providing a template that offers sites of ordered environment for the two halves of a symmetric molecule and a compound which can be arranged at each site, wherein the ordered environment distinguishes chemically or magnetically the two halves of a symmetric molecule arranged at each site, and wherein the ordered environment allows interaction via scalar coupling or dipolar coupling between the two halves of a symmetric molecule and a compound arranged at each site, d) bringing together the prepared fluid, the provided compound and the provided template, thereby transferring the spin order from the symmetric molecules to the hyperpolarizable nuclei of the compound during a temporary association of the symmetric molecules, the compound, and the template while ultimately keeping the chemical identity of the compound, and e) performing an NMR measurement on the compound comprising hyperpolarized nuclei prepared in step d)

that is characterised in that i) step d) is carried out in a chamber of the device, ii) that subsequently at least part of the compound is transported into the flow-through NMR probehead via one of the tubes using pressurized gas or a pump, iii) that subsequently step e) is performed on the compound present in the flow-through NMR probehead, iv) and that subsequently the compound present in the flow-through NMR probehead is transported into a chamber of the device using pressurized gas or a pump.

The device according to the invention can be particularly advantageous when used to contribute to an NMR preparation and measurement procedure according to PCT/EP2008/004865. This PCT application contains detailed explanations of steps a) to e) as well as procedure variations and examples which can be used in the framework of the inventive method; these explanations, procedure variations and examples are included in this application.

In the procedure according to the invention, non-equilibrium spin order is catalytically transferred to the compound (measurement substance) and measured in an NMR experiment. Afterwards, the same compound can be kept in readiness for another NMR experiment, because the previous spin order transfer has not affected the chemical structure. This takes place in a chamber of the inventive device, and the measurement sample can also, in one chamber of the device, quickly be subjected again to a transfer of non-equilibrium spin order. The compound (in the form of a liquid measurement sample) is therefore not used up and can be recycled, thus keeping costs down. The transport system using pressurised gas in particular shows its worth here; in particular the transport of the compound can be done exclusively by gas pressure. However, it is also possible to do the transport of the compound partially or completely by means of one or several pumps, which convey the compound in liquid phase/solution. The inventive method can in principle be performed continuously ("on flow" measurement) or discontinuously ("stopped flow" measurement).

In a preferred variant of the inventive method, the chamber into which the compound is transported in step iv) is identical with the chamber in which step d) according to step i) has been carried out. In other words, the compound just measured is transported back into the original chamber of its preparation. In this variant, only one chamber is necessary, which simplifies the design and saves compound.

A preferred further development of this variant provides that steps i) through iv) take place continuously and simultaneously for different parts of the compound. With the possibility of a persistent and incessant measurement of compound, particularly large amounts of measurement data can be generated in a short time. When a part (portion) of the compound is just being measured, at the same time another part (portion) of the compound is transported back into the chamber, another part (portion) is being reactivated, and another part (portion) is transported to the NMR probehead. This further development is typically realized with a pump in one of the tubes. As an alternative to this further development, it is also possible to stop the transport of compound during each NMR measurement; in this case a reactivation of compound can be performed in the chamber in parallel to the NMR measurement.

A preferred variant of the inventive method provides that a device comprising two chambers is used, and that after step iv), steps ii), iii) and iv) are repeated at least once for a further portion of the compound. In other words, in step i) a large amount of the compound is prepared, which is sufficient for filling the flow-through NMR probehead several times. After the measurement of one portion of the compound, the probehead is filled with some of the remaining prepared compound and another NMR measurement takes place. In this way, a large number of NMR measurements can quickly take place one after another without having to prepare new samples. Compound already measured is stored in a second chamber in the meantime, usually until the compound in the first chamber has been completely used up.

An advantageous further development of this variant is characterized in that the repeated steps ii) through iv) take place continuously and simultaneously for different parts of the compound. In this case, too, it is possible to measure persistently and incessantly compound over a large time interval (namely as long as the supply of activated compound of step i) lasts), such that a particularly large amount of measurement data can be generated in a short time span. Alternatively, it is possible to stop the transport of compound during the NMR measurement.

Particularly preferable is a method variant which provides that following step iv), in a step v) the compound transported out is shaken or is subjected to a controlled magnetic field, in particular an alternating magnetic field, in the chamber, following which steps ii) and iii), and preferably also step iv), are performed on the compound treated in step v) again. In step v) the compound which has just been measured undergoes further activation, i.e. spin order is once again transferred from the gas with the spatially symmetrical molecules (mostly para-hydrogen, $pH_2$) to the compound, or the transfer is assisted. In step v), there is typically (and preferably) no further addition of gas containing symmetrical molecules from a reservoir; instead the remaining gas which is already present in the device is used. After steps v), ii), iii) and iv) have been performed, further cycle(s) of the same steps can be begun. If the compound is measured in more than one portion, step v) occurs typically after step iv) of the last repetition of steps ii), iii) and iv). The compound dealt with in step v) can then be measured again, in more than one portion.

In an advantageous further development of this variant, steps i) and v), and possible repetitions of step v), take place in the same chamber. This means that only one chamber needs to be equipped with the means of activation (such as a shaker or an alternating magnetic field generator). If necessary, the compound for step v) can first be transported from one chamber into another (for example by gas pressure).

In an alternative, just as advantageous development of the variant above, steps i) and v), and possible repetitions of step v) which follow one another, take place in different chambers. In this case the compound will be reactivated in the chamber to which it has been transported following a successful measurement; it is then quickly available once more for further NMR measurements. The transportation from one chamber to another is thus not necessary.

In another, preferred method variant, the compound in the chamber in step i) and/or step v) is subjected to a static magnetic field between $10\,\mu T$ and $0.5\,T$, in particular between $0.1\,mT$ and $0.5\,T$. The static magnetic field can improve the spin order transfer from the gas containing symmetrical molecules to the compound (i.e. its hyperpolarisable nuclei). Note that alternatively, in accordance with the invention, it is also possible to subject the chamber to a static magnetic field lower than $10\,\mu T$, or to subject the chamber to no static magnetic field at all.

Particularly preferable is another variant in which a buffer gas, in particular $N_2$ or a noble gas, is at least partly used for the transport of the compound using pressurised gas. The buffer gas may be, in particular, an inert gas. The cheap buffer gas can be used for the transport of the compound, meaning that this task is not performed by the gas containing the symmetrical molecules (for instance, $pH_2$), which is usually more expensive. In this way costs can be reduced.

Further advantages of the invention can be extracted from the description and the enclosed drawing. The features mentioned above and below can be used in accordance with the invention either individually or collectively in any combination. The embodiments described and shown are not to be understood as exhaustive enumeration but rather have exemplary character for the description of the invention.

BRIEF DESCRIPTION OF THE DRAWING

The invention is represented in the diagrams and is, with the help of examples, explained in more detail, as follows.

DESCRIPTION OF THE PREFERRED EMBODIMENT

Figure 1A:
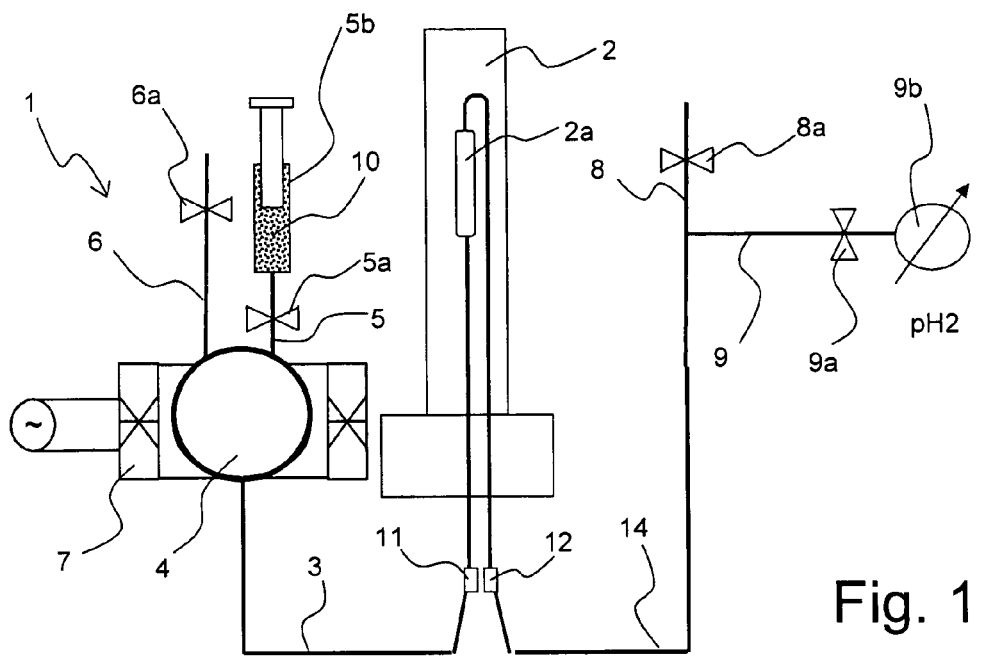
FIG. 1a-1f a first embodiment of a device according to the invention, with a single chamber, at various stages of the inventive method.

FIG. 1a shows schematically a first embodiment of a device according to the invention for the preparation and measurement of a liquid NMR measurement sample.

Device 1 includes an NMR flow-through probehead 2, in which a measurement cell 2a is present, and which is arranged inside a typically superconducting magnet (not shown). The probehead 2 is connected via a first tube 3 to a chamber 4. The chamber 4 has a sample inlet 5, which is secured with a sample valve 5a, which is connected to a sample reservoir 5b. In the sample reservoir 5b is a liquid measurement sample 10 (represented by the dot pattern), containing a compound (measurement substance). The compound contains hyperpolarisable nuclei for an NMR measurement. The chamber 4 also has a gas outlet 6 with a gas outlet valve 6a.

The inner space of the chamber 4 can, using a facility 7 for the generation of an alternating magnetic field (here, a magnetic coil arrangement chargeable with an alternating current), be exposed to an alternating magnetic current. In the chamber 4, a template (catalyst, polarisation transfer medium) is also present, here in the form of a coating on the inner surface of the chamber (not represented in detail). The chamber 4 is thus designed as a preparation chamber (with activation device and template).

The probehead 2 is further connected to a second tube 14, which leads to a connection for releasing the gas pressure 8 with a gas-pressure release valve 8a and a connection for increasing the gas pressure 9 with a gas-pressure increase valve 9a and a pressurised gas reservoir 9b. The pressurised gas reservoir 9b is here stocked with para-hydrogen under excess pressure. The gas pressure in the chamber 4 can be indirectly influenced or adjusted by the connection for releasing the gas pressure 8 and the connection for increasing the gas pressure 9 through the probehead 2, which is switched in between.

A first liquid sensor 11 is implemented in the first tube 3, and the second tube 14 contains a second liquid sensor 12.

In the situation shown in FIG. 1a, the chamber 4 is not yet filled with the liquid measurement sample 10. The tubes 3, 14 are likewise not yet filled with the measurement sample 10, as shown by the unbroken lines.

Figure 1B:
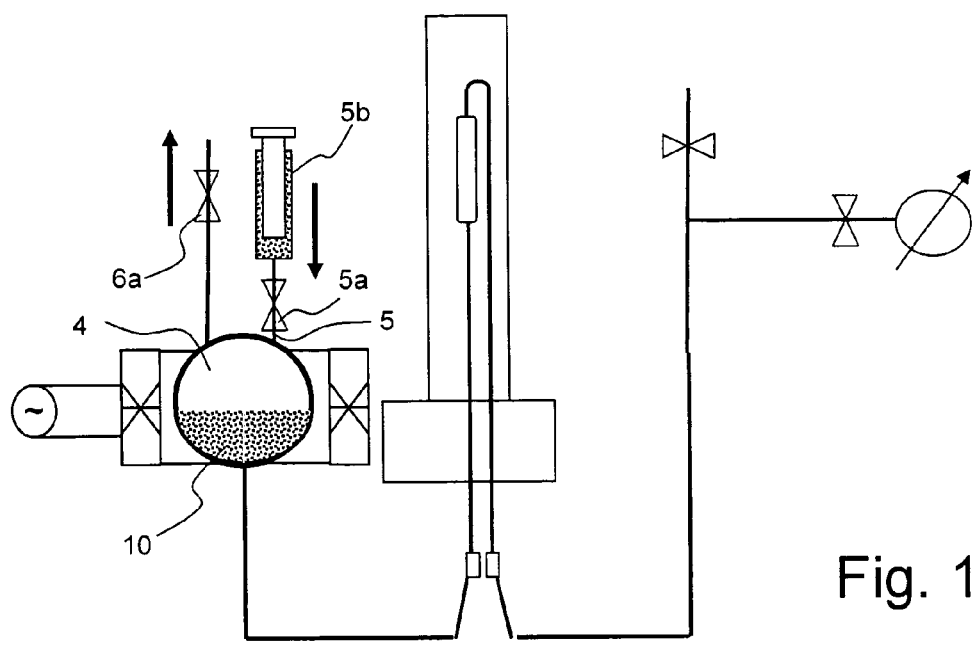

FIG. 1b illustrates the filling of the chamber 4. The sample valve 5a is opened, allowing the measurement sample 10 to flow from the sample reservoir 5b into the chamber 4 (here by means of an injection). To avoid resistance against the inflow resulting from the growing gas pressure in the chamber 4, the pressure release valve 6a is also opened. (This is not necessary when the sample inlet 5 is not tightly closed against the surroundings during inflow of the measurement sample.)

Figure 1C:
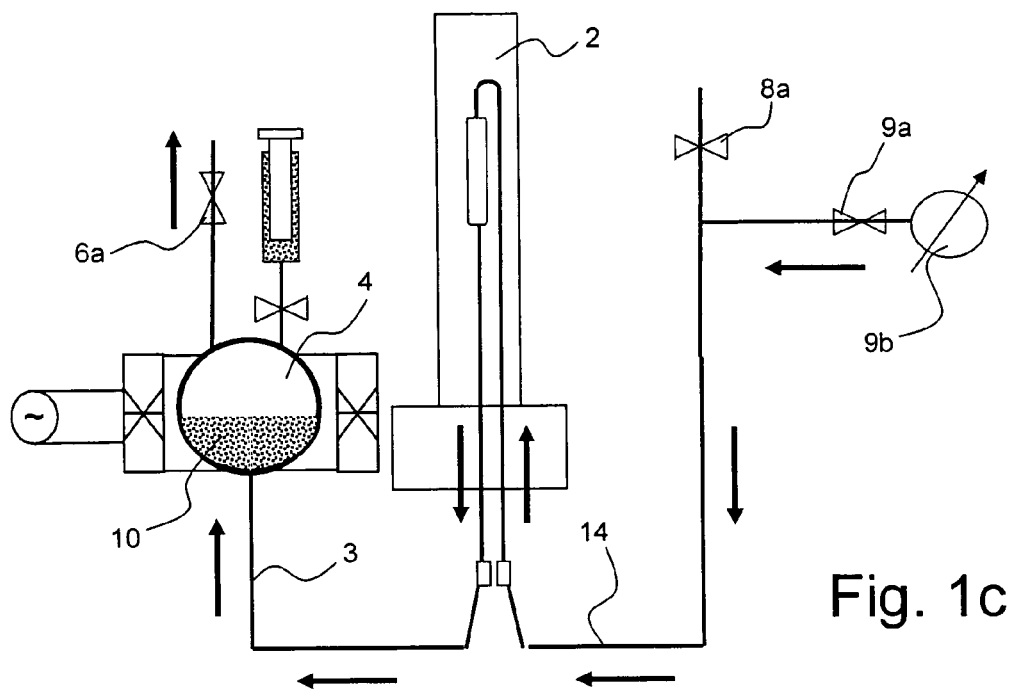

Gas is added to the measurement sample 10 with (here) para-hydrogen from the pressurised gas reservoir 9b, shown in FIG. 1c. For this, the gas-pressure increase valve 9a is opened. Para-hydrogen flows through the probehead 2 and the tubes 3, 14 and into the measurement sample 10 in the chamber 4 from below, causing mixing between the measurement sample 10 and the para-hydrogen (which contains symmetrical molecules with non-equilibrium spin order). To achieve this, the first tube 3 flows into a part of the chamber 4 above which the measurement sample 10 is present (here, at the lowest point of the chamber 4). In order to avoid the gas pressure in the chamber 4 increasing, the pressure release valve 6a is opened (Alternatively, it is possible increase the gas pressure already during the filling of the chamber).

Figure 1D:
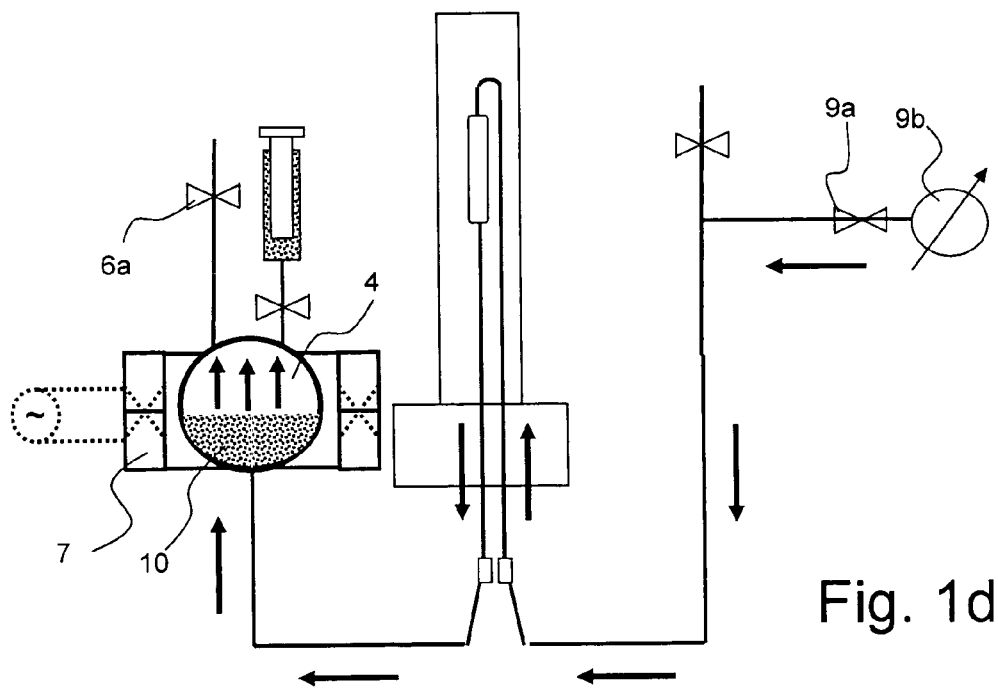

The pressure increase in the chamber 4 takes place subsequently, as shown in FIG. 1d. After closing the pressure release valve 6a, the inflowing para-hydrogen builds up in the chamber 4 above the measurement sample 10 while increasing the gas pressure until it balances the pressure in the pressurised gas reservoir 9b. At this point the gas-pressure increase valve 9a can once again be closed. After this (or even during the pressure increase), the facility 7 is subjected to an alternating current, so that the spin order transfer is carried out by the entirety of the measurement sample 10 (containing the measurement substance with the hyperpolarisable nuclei), the template and the para-hydrogen, which have been brought together in the chamber 4.

Figure 1E:
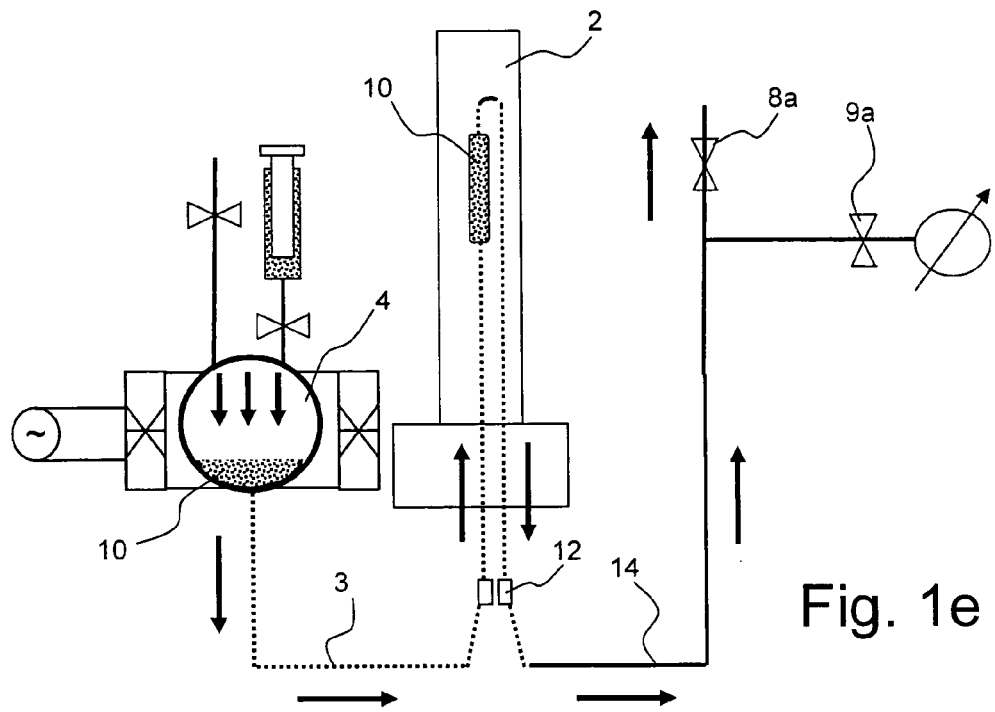

The increased gas pressure in the chamber 4 is now used to transport the measurement sample 10 to the probehead 2, cf. FIG. 1e. After closing the gas-pressure increase valve 9a, the gas-pressure release valve 8a is opened. The pressurised gas in the chamber 4 pushes the measurement sample 10 through the first tube 3 into the probehead 2, and, in particular, into the measurement cell 2a, and also beyond thereof into the second tube 14 (see tubes 3, 14 in FIG. 1e, which are filled with the measurement sample 10 and thus represented by dotted lines).

Figure 1F:
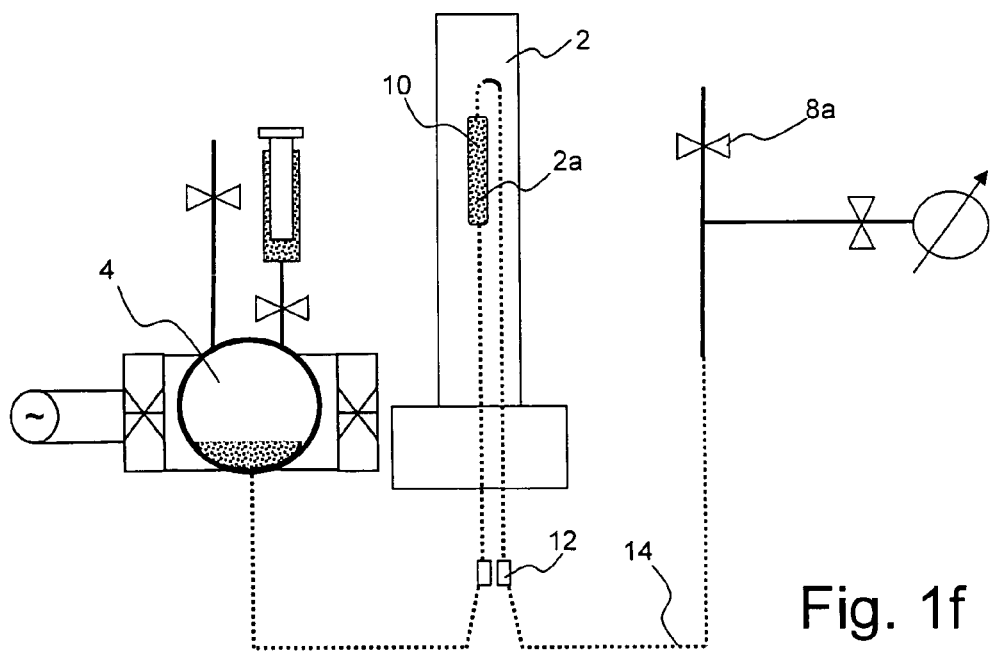

As soon the second liquid sensor 12 has registered the liquid measurement sample 10 in the second tube 14, the gas-pressure release valve 8a is closed promptly, cf. FIG. 1f, so that the measurement sample stops flowing. Under these conditions, the measurement sample 10 present in the measurement cell 2a of the probehead 2 can be measured in an NMR experiment.

In the situation shown in FIG. 1f, it is preferable for the gas pressure in the chamber 4 to have normalised itself again. After NMR measurement of the measurement sample 10 is complete, it can then be transported back into the chamber 4 by opening the gas-pressure increase valve 9a (which corresponds to the situation shown in FIG. 1d), and the procedure continues as already described. In particular, the gas pressure in the chamber 4 can once again increase, and the measurement sample 10 can again be activated with the para-hydrogen still present (and partly replaced). Then, by opening the gas-pressure release valve 8a, the measurement sample 10 can again be transported into the measurement cell 2a and be measured, and so on.

Figure 2A:
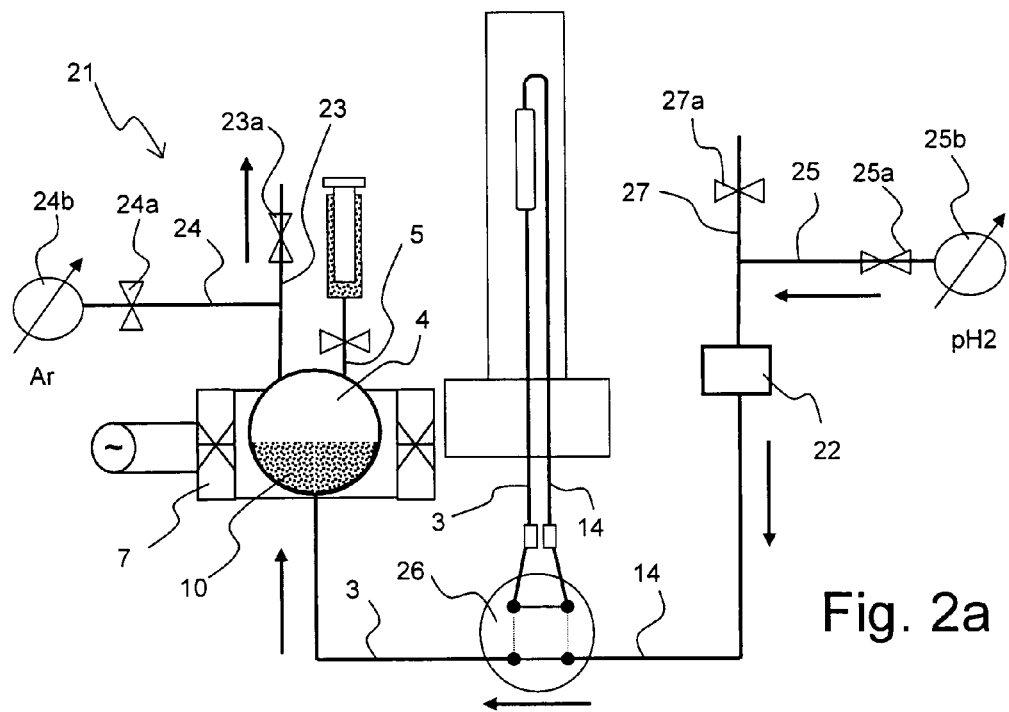
FIG. 2a-2d a second embodiment of a device according to the invention, with a second chamber as an equalisation container, at various stages of the inventive method.

FIG. 2a shows a second embodiment of a device 21 according to the invention for the preparation and measurement of a liquid NMR measurement sample. In the following, it is primarily the differences between this device and the device shown in FIGS. 1a-1f which are explained.

The device 21 has a first chamber 4, which is especially designed with a facility 7 to be a preparation chamber, and a second chamber 22, which is designed to be an equalisation container. The first chamber 4 has a local connection for releasing the gas pressure 23 with a gas-pressure release valve 23a, and a local connection for increasing the gas pressure 24 with a gas-pressure increase valve 24a and a pressurised gas reservoir 24b to contain a pressurised inert transport gas, here argon. The second chamber 22 likewise has a local connection for releasing the gas pressure 27 with a gas-pressure release valve 27a, and connection for increasing the gas pressure 25 with a gas-pressure increase valve 25a and a pressurised gas reservoir 25b in which para-hydrogen, as a reaction gas with symmetrical molecules and non-equilibrium spin order, is stored under excess pressure.

The two chambers 4, 22 are connected to each other via the first tube 3, the probehead 2 and the second tube 14. The tubes 3, 14 have an integrated valve means 26. In one position, shown in FIG. 2a, the valve means 26 links the tubes 3, 14 together thereby shorting both the probehead and chamber sides.

FIG. 2a illustrates the situation during the introduction of gas (para-hydrogen) to the measurement sample 10 in the first chamber 4, with both the gas-pressure increase valve 25a of the second chamber 22 and the gas-pressure release valve 23a of the first chamber 4 open. Subsequently, the measurement sample 10 is activated in the first chamber 4 with the facility 7 (not shown separately).

Figure 2B:
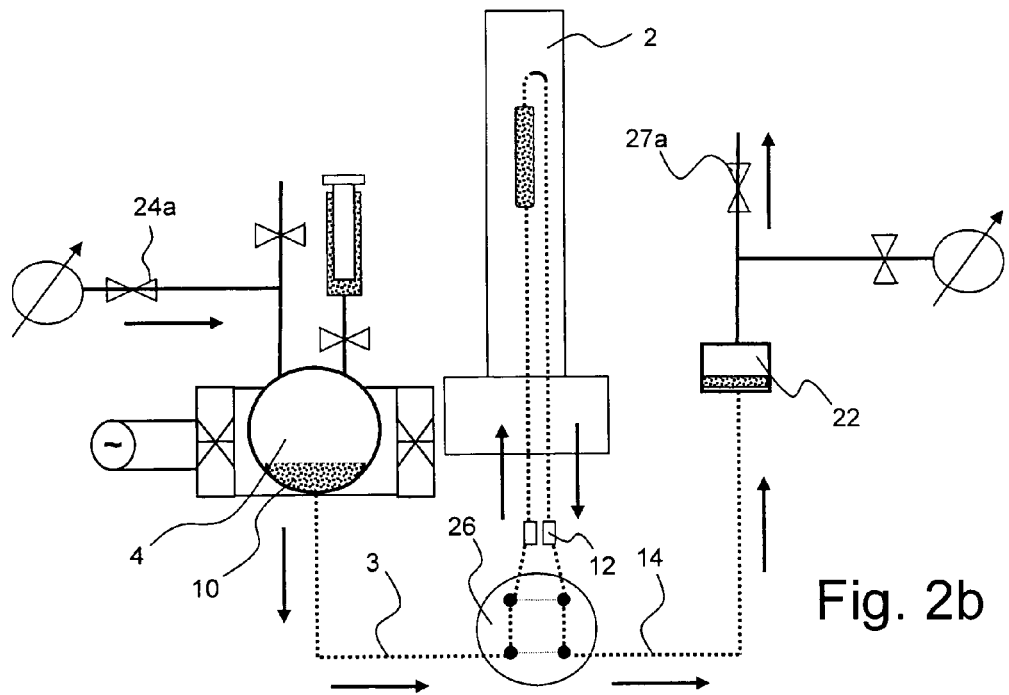

Then a portion of the measurement sample 10 is passed into the probehead 2 by opening the gas-pressure increase valve 24a of the first chamber 4 and so allowing high-pressure transport gas into the system, cf. FIG. 2b. To do this, the valve means 26 is in a second position, in which the first tube 3 from the first chamber 4 connects to the probehead 2, and also the second tube 14 connects from the probehead 2 to the second chamber 22. As shown in FIG. 2b, the gas-pressure release valve 27a of the second chamber 22 is opened at the same time, so that no pressure builds up in the second chamber 22. (Alternatively, to conserve reaction gas, the gas-pressure release valve 27a could be closed during this phase, causing a build-up of gas pressure in the second chamber 22.)

Figure 2C:
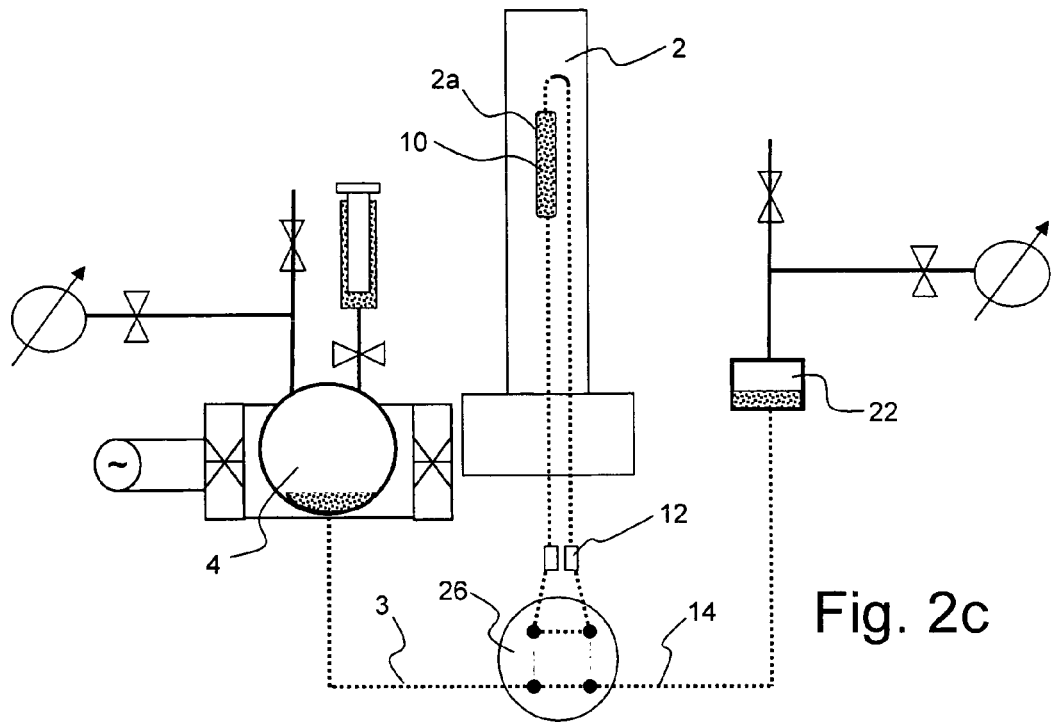

As soon as a sufficient amount of measurement sample 10 has flowed into the probehead 2, which can be recognised using the second liquid sensor 12 (or which can be ensured by transporting measurement sample 10 for a sufficiently long period of time at a calibrated transfer speed), the valve means 26 is put back into its first position, cf. FIG. 2c. Because of the short circuit between tubes 3, 14 on the probehead side, the flow conditions in the probehead 2 (no flow) remain stable, and NMR measurement of the liquid measurement sample 10 available in the measurement cell 2a can take place. At the same time, as shown in FIG. 2c, a pressure equalisation in both chambers 4, 22 occurs, via the short circuit between tubes 3, 14 on the chamber side.

Figure 2D:
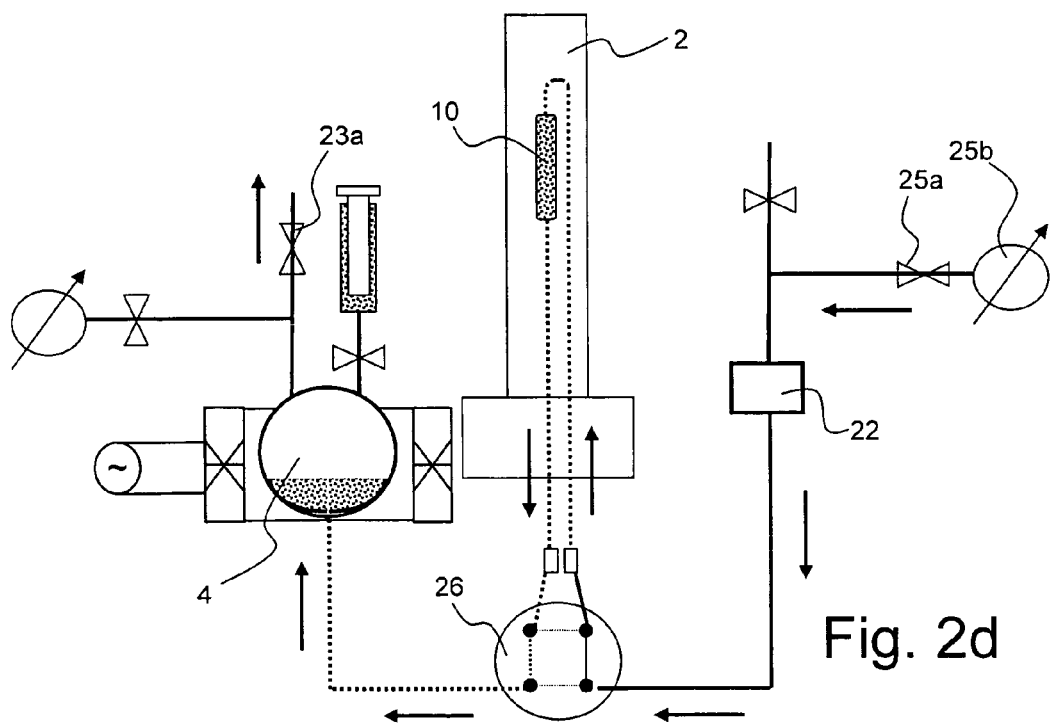

To transport back the measurement sample out of the second chamber 22 and the probehead 2, the gas-pressure increase valve 25a of the second chamber 22 and the gas-pressure release valve 23a of the first chamber 4 can be opened, cf. FIG. 2d. In doing this, the reaction gas (pH$_2$) from the pressurised gas reservoir 25b is used to transport the measurement sample 10. (If an excess pressure of transport gas has previously built up in the second chamber 22 and has not been removed during the measurement, this can also be used for the return transport of the measurement sample 10; to do this, valve means 26 can be replaced by a simple blocking valve in one of the tubes 3, 14 or by two simple blocking valves in each of the tubes 3, 14.)

Figure 3A:
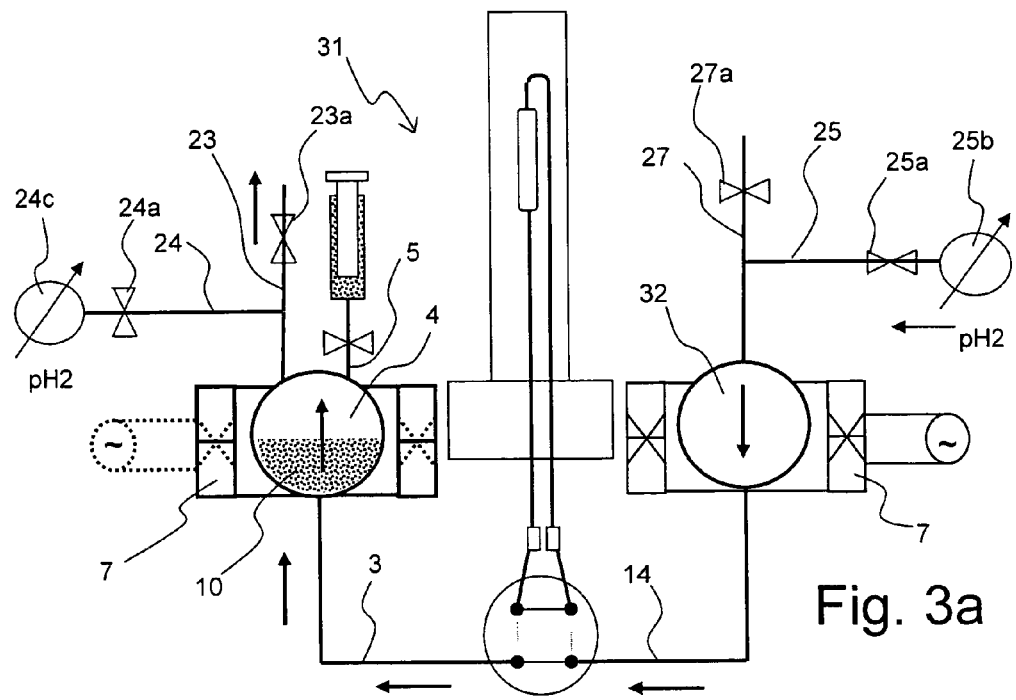
FIG. 3a-3f a third embodiment of a device according to the invention, with a second chamber for the activation of the compound (measurement substance), at various stages of the inventive method.

FIG. 3a describes a third embodiment of a device according to the invention for the preparation and measurement of an NMR measurement sample. Again, it is primarily the differences between this and the device in FIGS. 2a-2d which are explained.

The device 31 has a first chamber 4 and a second chamber 32, both of which are provided with a facility 7 for the generation of an alternating magnetic field and with a template (not shown), and which are thus designed as preparation chambers. Chambers 4, 32 each have a connection for releasing the gas pressure 27, 23 and a connection for increasing the gas pressure 24, 25. Both pressurised gas reservoirs 24c, 25b are stocked with para-hydrogen under excess pressure.

FIG. 3a shows the situation during the introduction of gas (para-hydrogen) to the measurement sample 10 in the first chamber 4. The para-hydrogen flows from the pressurised gas reservoir 25b of the second chamber 32 through the tubes 3, 14 short-circuited on the chamber side.

Figure 3B:
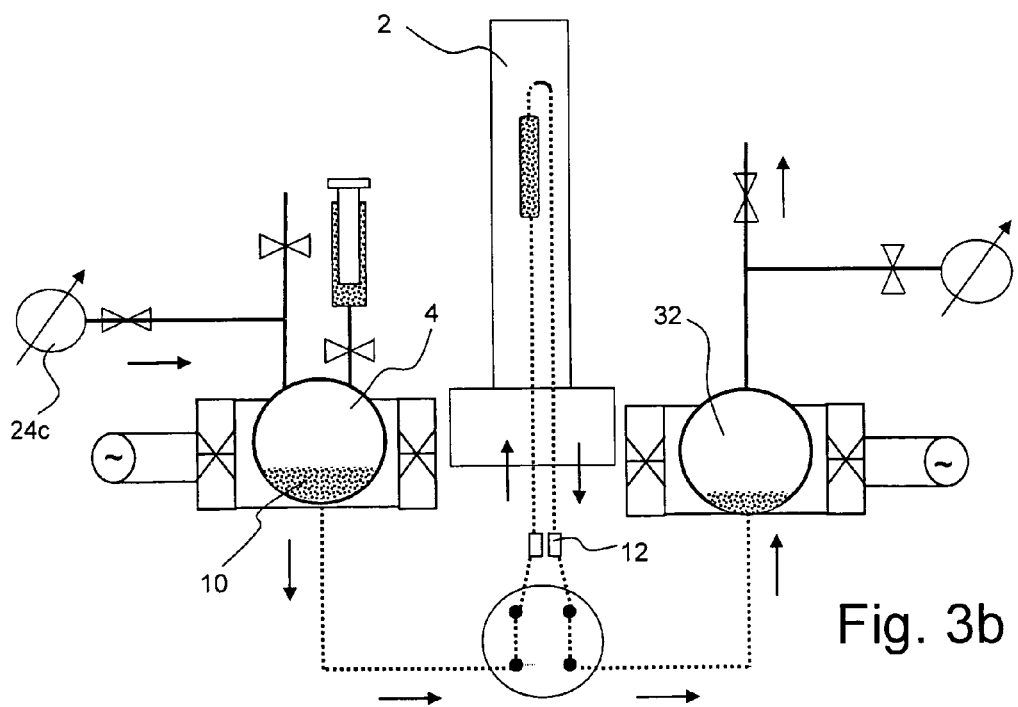

Subsequently, the first portion of the measurement sample 10 is transported from the first chamber 4 into the probehead 2 using pressurised gas from the pressurised gas reservoir 24c of the first chamber 4; a small amount is also transported into the second chamber 32, cf. FIG. 3b.

Figure 3C:
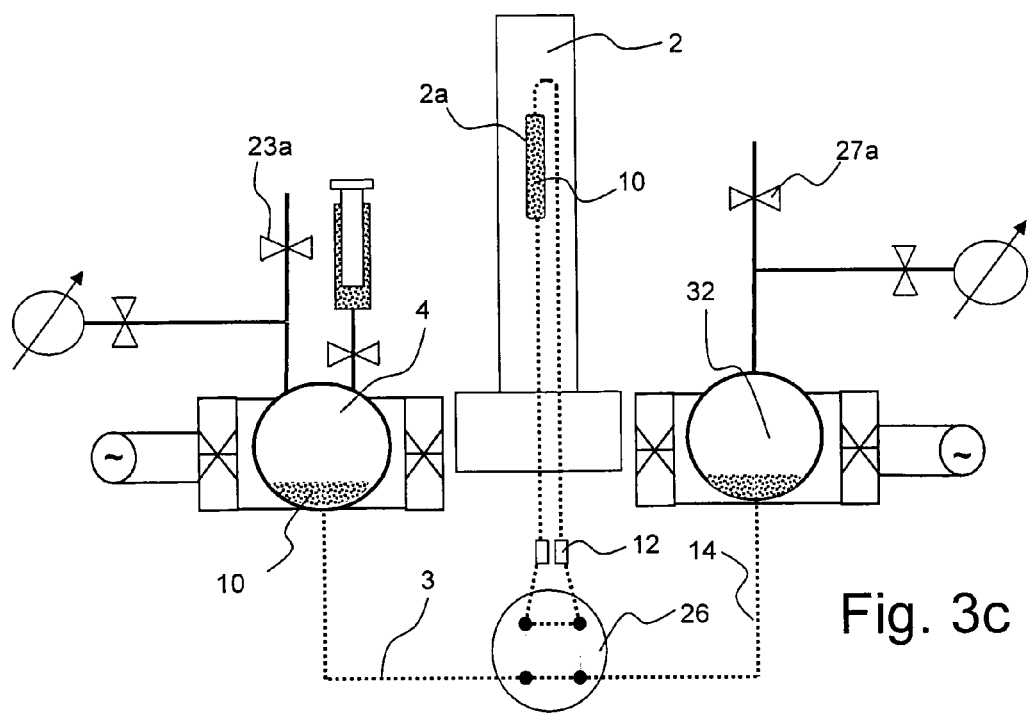

When a sufficient amount of the measurement sample 10 has been transported to the probehead 2, which can be recognised using the liquid sensor 12, the increase of pressure is stopped and the valve means 26 is set so that the probehead 2 is isolated. With a short circuit via the valve means 26 on the probehead side, the liquid measurement sample 10 contained in the measurement cell 2a to undergoes an NMR measurement, cf. FIG. 3c. At the same time, the pressure in the chambers 4, 32 equalises via the short circuit of the tubes 3, 14 on the chamber side, during which the gas-pressure release valves 23a, 27a are closed.

Figure 3D:
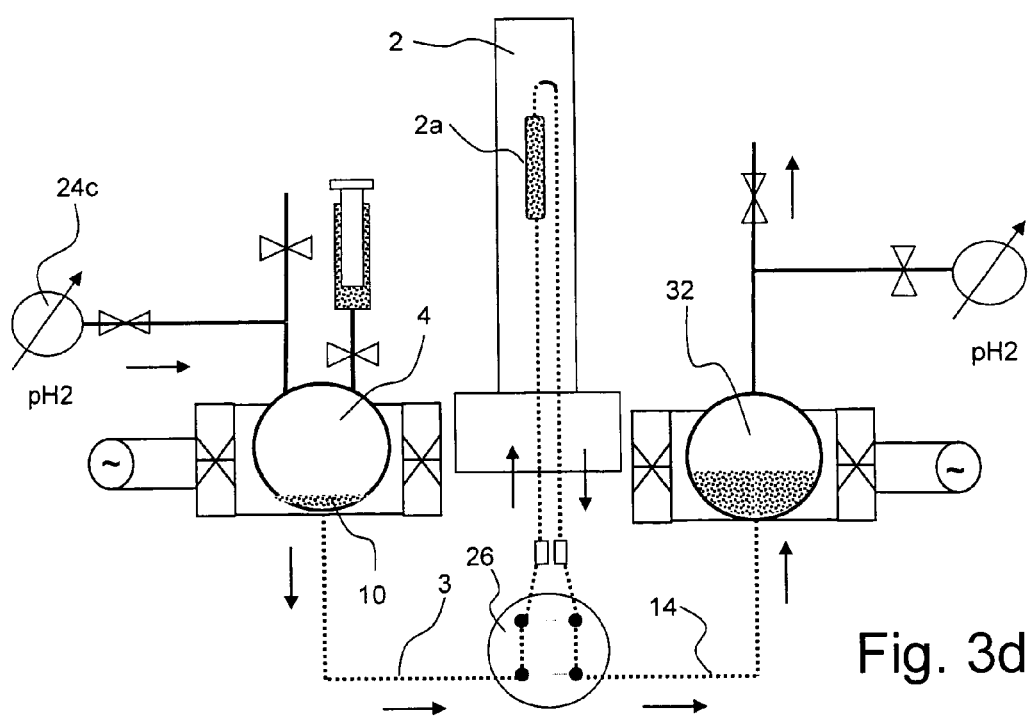

Then a second portion of the measurement sample 10 from the first chamber 4 is transported into the probehead 2 using pressurised gas from the pressurised gas reservoir 24c of the first chamber 4, cf. FIG. 3d. At the same, the just before measured measurement sample 10 from the measurement cell 2a is transported into the second chamber 32. After the probehead 2 is again isolated using the valve means 26, a further measurement of the measurement sample 10 now present in the measurement cell 2a can be carried out (measurement of the measurement sample in portions, not separately shown). Note that sufficient amounts of the measurement sample for a new filling of the measurement cell 2a can be determined by means of a flow-through meter in a tube 3, 14 or through measurements of the filling level in chambers 4, 32.

Figure 3E:
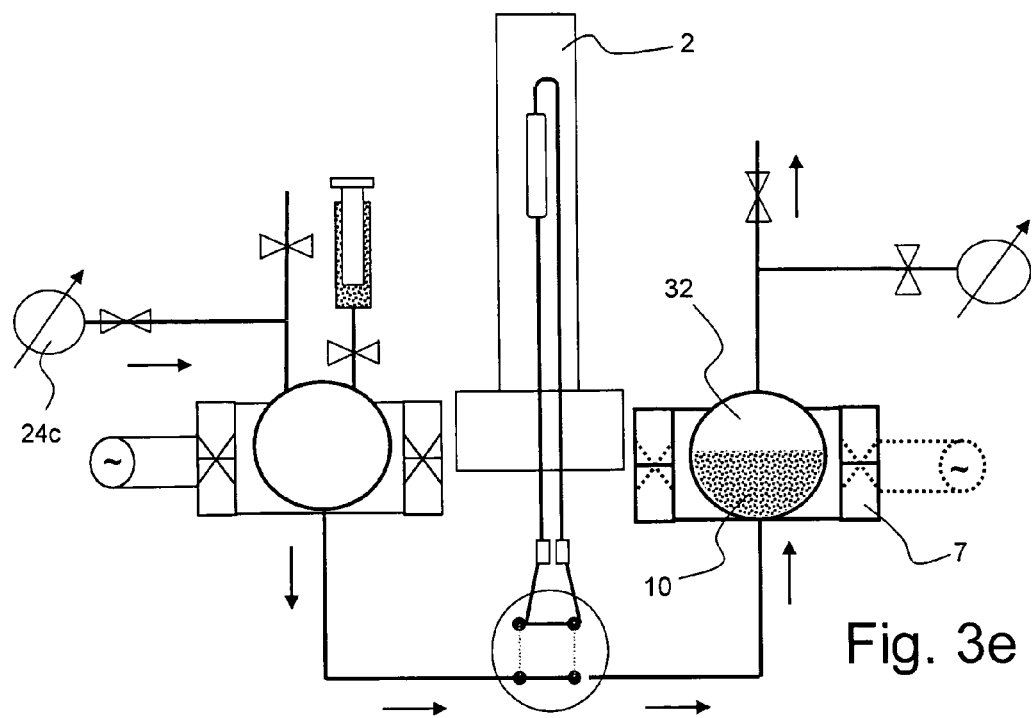

After all of the measurement sample 10 has been transported into the second chamber 32 (after, if need be, individual measurements of the measurement sample divided into portions), it can be reactivated using the facility 7 attached to the second chamber 32. Additionally, the introduction of gas (para-hydrogen) from the pressurised gas reservoir 24c of the first chamber 4 to the measurement sample can take place again, cf. FIG. 3e.

Figure 3F:
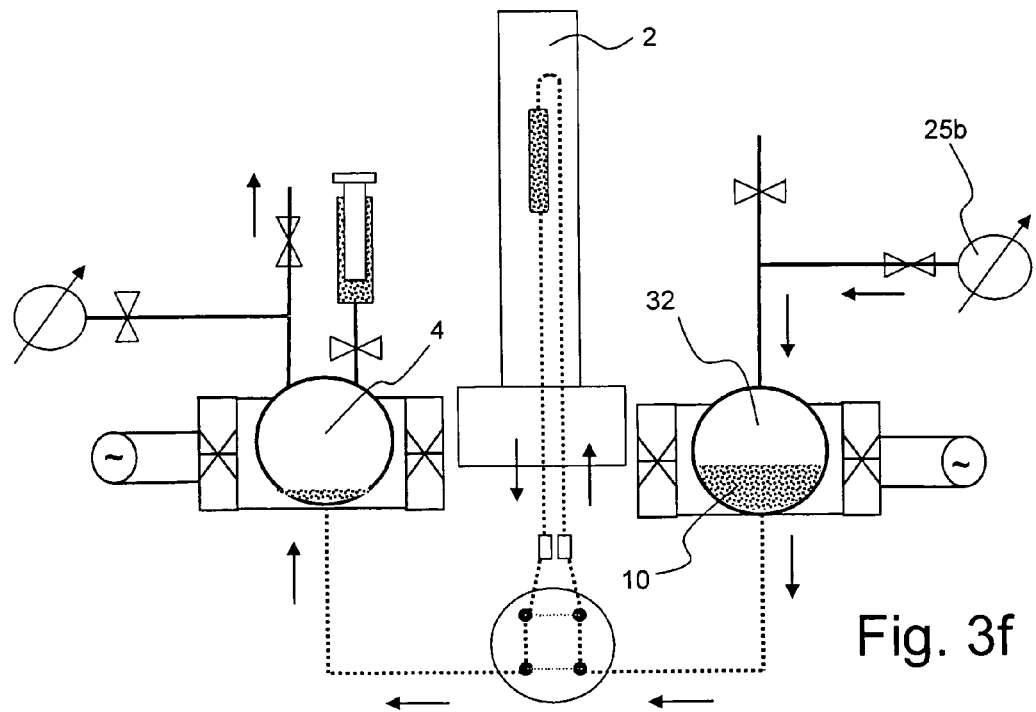

The measurement sample 10 can finally be transported from the second chamber 32 into the first chamber 4 by increasing the gas pressure using the pressurised gas reservoir 25b of the second chamber 32, cf. FIG. 3f, allowing a further portion of the measurement sample 10 to be measured in the probehead 2 after each transport step, and so on.

Figure 4A:
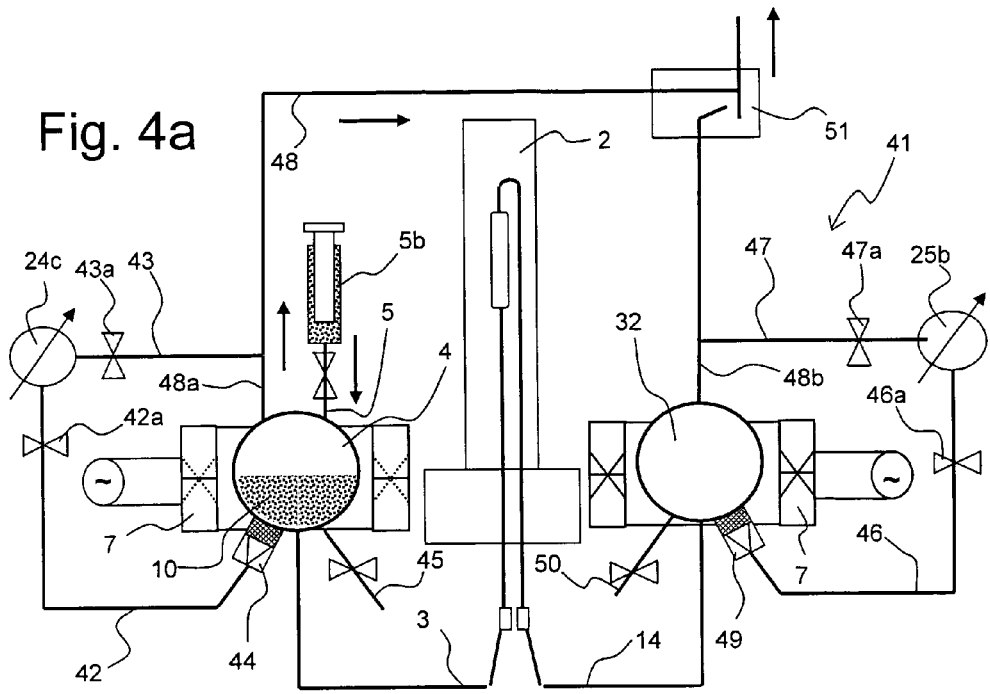
FIG. 4a-4e a fourth embodiment of a device according to the invention, with an equalisation tube, at various stages of the inventive method.

FIG. 4a describes a fourth embodiment of a device according to the invention for the preparation and measurement of an NMR measurement sample. Once again, it is primarily the differences between this and the device in FIGS. 3a-3f which are explained.

This device 41 also has two chambers 4, 32 which are both designed as preparation chambers equipped with a facility 7 for the generation of an alternating magnetic field inside each chamber 4, 32.

The first chamber 4 comprises a lower connection for increasing the gas pressure 42, which leads via a frit 44 and a one-way valve (not shown) into the chamber 4 below the surface of the measurement sample 10 which is all contained in the chamber 4. An upper connection for increasing the gas pressure 43 is also provided for the chamber 4, ending above the surface of the liquid (and partly running through an equalisation tube 48). Both connections 42, 43 can be closed off from a pressurised gas reservoir 24c containing para-hydrogen using the gas-pressure increase valves 42a, 43a. An additional valve-controlled release tube 45 running from the first chamber 4 to an outlet or a waste container is also provided. In a similar way, the second chamber 32 also has a lower connection for increasing the gas pressure 46 with a frit 49 and an upper connection for increasing the gas pressure 47, gas-pressure increase valves 46a, 47a and a valve-controlled release tube 50.

The first and second tubes 3, 14 lead directly (without valves) from the chambers 4, 32 to the probehead 2.

Both chambers 4, 32 can be connected to each other via the equalisation tube 48 and equalisation valve 51. Pressure can also be released from the chambers 4, 32 using this equalisation valve 51, meaning that the connections of the equalisation tube 48 at the chambers 4, 32 can be considered as connections for releasing the gas pressure 48a, 48b.

FIG. 4a shows the situation during the filling of the first chamber 4 with the measurement sample 10 from the sample reservoir 5b. During this, the equalisation valve 51 opens the connection for releasing the gas pressure 48a of the chamber 4. Note that the (normal) gas pressure in the second chamber 32 prevents the overflowing of the measurement sample 10 through the probehead 2.

Figure 4B:
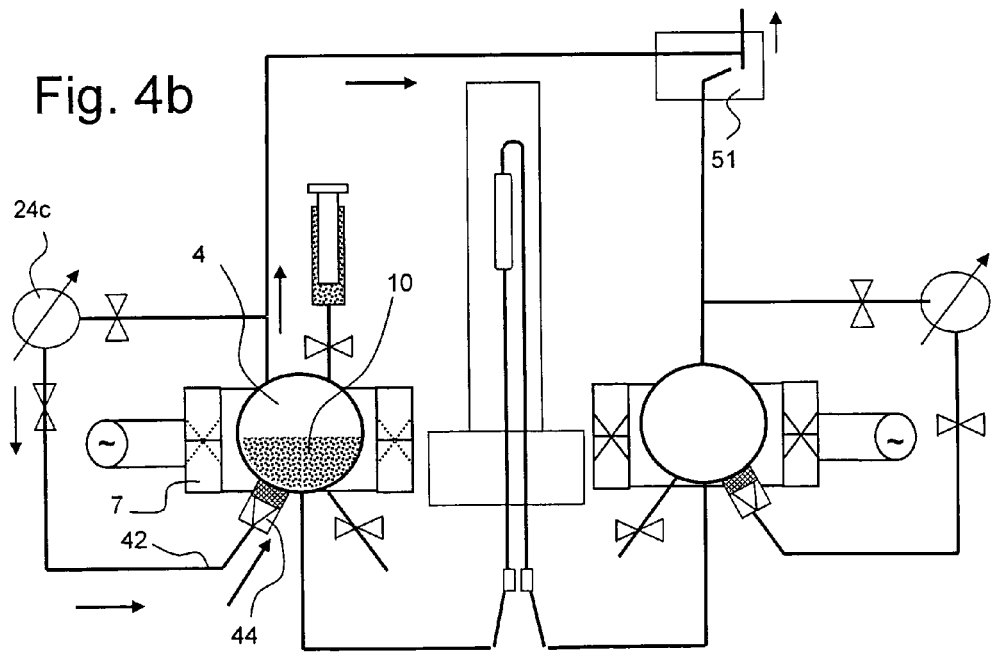

FIG. 4b illustrates the introduction of gas to the measurement sample 10 in the first chamber 4 through the frit 44 of the lower connection for increasing the gas pressure 42. Thereby, para-hydrogen flowing from the pressurised gas reservoir 24c is finely bubbled into the liquid measurement sample, causing the measurement sample 10 and pH$_2$ gas to be well mixed. The equalisation valve 51 remains in the same position for this purpose. During this process, or afterwards, the measurement sample 10 is activated using the facility 7 of the first chamber 4.

Figure 4C:
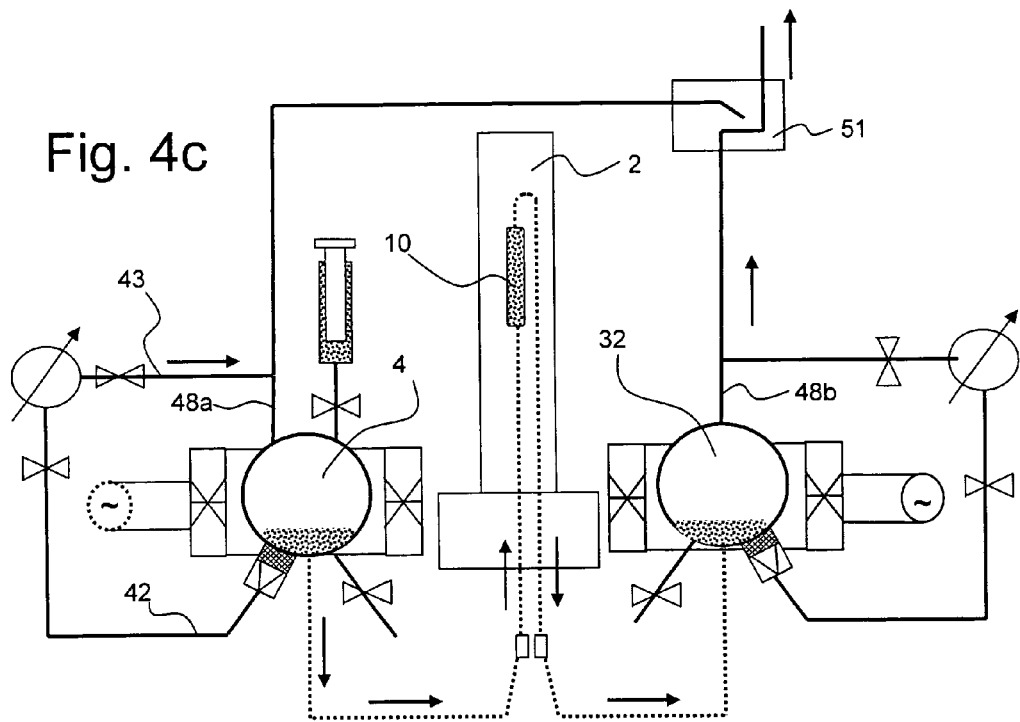

FIG. 4c illustrates the transfer of measurement sample 10 from the first chamber 4 into the probehead 2 and (through the probehead 2) into the second chamber 32. To do this, the gas pressure in the first chamber 4 is increased using the upper connection for increasing the gas pressure 43 (it would also be possible to use the lower one 42). At the same time, the equalisation valve 51 closes the connection for releasing the gas pressure 48a of the first chamber 4. However, using the connection for releasing the gas pressure 48b and the equalisation valve 51, the gas pressure in the second chamber 32 is released.

Figure 4D:
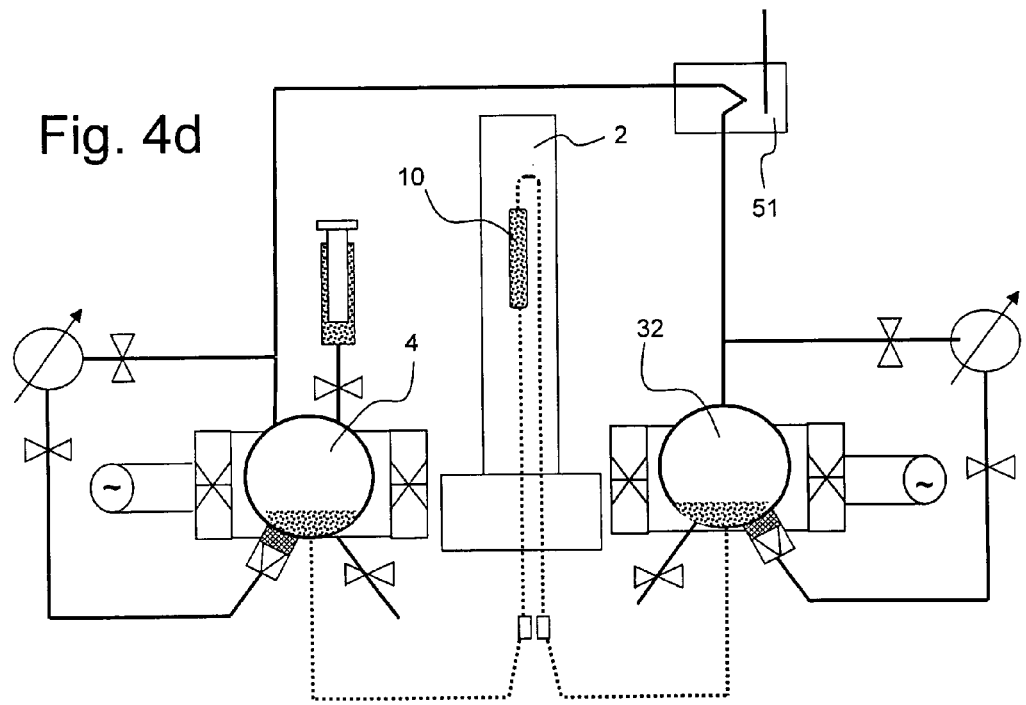

To measure the measurement sample 10 in the probehead 2, the gas inflow is turned off and the equalisation valve 51 is completely closed (that is, a short circuit is created on the chamber side), see FIG. 4d. By this means, further flow of liquid measurement sample 10 is prevented.

As already described in FIGS. 3a-3f, measurement sample can have gas introduced to it and be activated in the second chamber 32, and can again be transported from the second chamber 32 back to the first chamber 4 through the probehead 2.

Figure 4E:
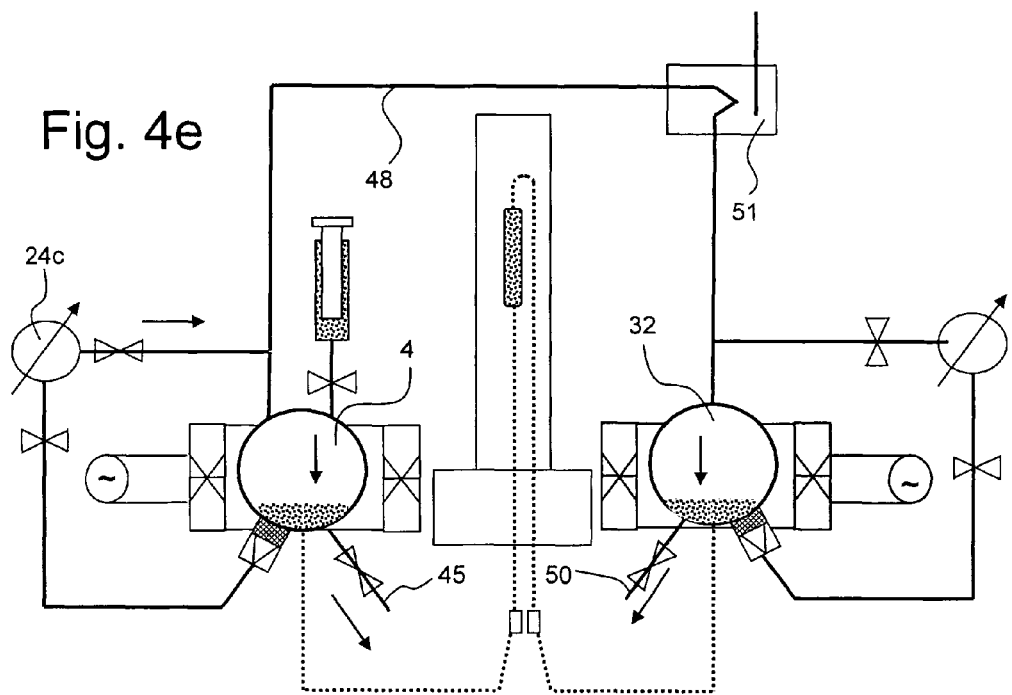

Additionally, FIG. 4e shows that by increasing the gas pressure using (here) only one of the pressurised gas reservoirs (here, 24c), both chambers 4, 32 can be emptied via the release tubes 45, 50; thereby, the equalisation valve 51 creates a short circuit between the chambers 4, 32 via the equalisation tube 48.

Figure 5A:
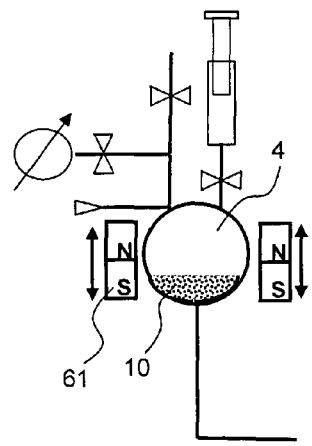
FIG. 5a a schematic representation of an activation device with movable permanent magnets for a chamber of an inventive device.

FIG. 5a shows an example of a method of activating the measurement sample 10 in chamber 4 of the invention, in which permanent magnets close to the outside of the chamber 4 are moved, in particular oscillating with a frequency of between 1 Hz and 1000 Hz. This is an effective means of generating an alternating magnetic field, which improves the spin order transfer between para-hydrogen and the hyperpolarisable nuclei of the compound (measurement substance) in the measurement sample 10. Note that the template used to prepare the sites of the ordered environment can be present in a dissolved state in the measurement sample 10.

Figure 5B:
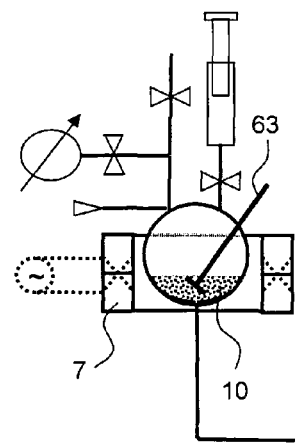
FIG. 5b a schematic representation of an activation device with magnetic coils for a chamber of an inventive device.

FIG. 5b illustrates the activation of the measurement sample 10 in the described invention using an alternating magnetic field generated by the facility 7, which contains magnetic coils charged with an alternating current. This method is also capable of creating an alternating magnetic field inside chamber 4. FIG. 5b also shows a stirrer 63, with which the mixing between the measurement sample 10 and the overlying gas can be improved or induced, especially when the gas cannot be introduced (or cannot be finely bubbled in) below the surface of the liquid measurement sample 10.

Figure 5C:
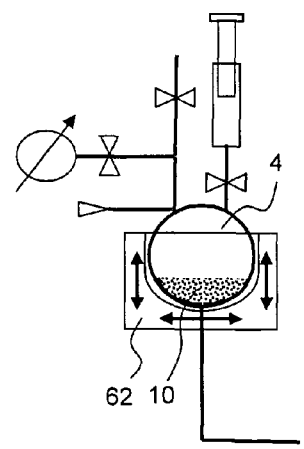
FIG. 5c a schematic representation of an activation device with a shaker for a chamber of an inventive device.

FIG. 5c shows a shaking device 62, with which the chamber 4 and its contents, especially the measurement sample 10, can be accelerated and slowed down again in various directions ('shaken') in order for activation to occur. This mechanical handling per se can promote spin transfer. It is also possible to expose the chamber 4 to a background magnetic field, which can likewise improve the activation. If the background field around the chamber 4 is inhomogeneous, the shaking movement can also effectively bring about an alternating magnetic field in the chamber 4. Note that for shaking, the chamber 4 should be connected to the other parts of the device for preparation and measurement of an NMR measurement sample with flexible lines, for instance synthetic tubes or flexible glass capillary tubes.

Figure 6:
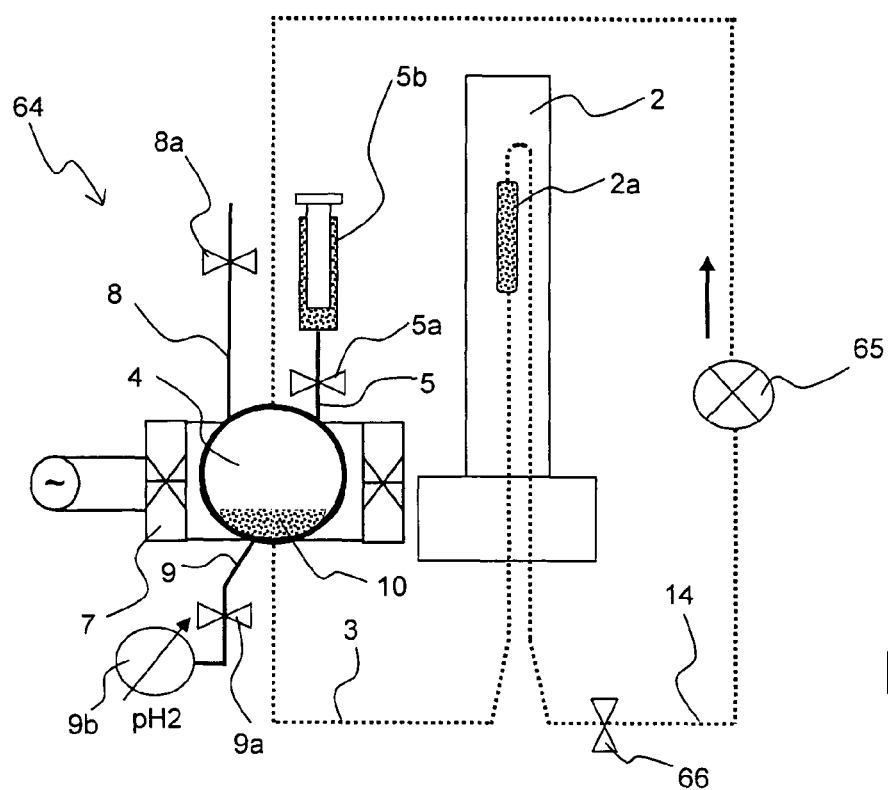
FIG. 6 a fifth embodiment of a device according to the invention, which is designed with a loop for liquid measurement sample and a pump.

FIG. 6 shows a further embodiment of an inventive device 64 for the preparation and measurement of an NMR measurement sample. It is primarily the differences with respect to FIG. 1a-1f which are explained.

The device 64 comprises a chamber 4, which is connected to a flow-through NMR probehead 2 via a first tube 3 and a second tube 14. Thereby, a loop is established for liquid measurement sample 10. Liquid measurement sample 10 is in the chamber 4, in the tubes 3, 14 and also in the measurement cell 2a of the probehead 2.

By means of the pump 65, which is arranged in the second tube 14 here, liquid measurement sample 10 can be pumped; preferably liquid measurement sample 10 is only pumped in one direction (here counter-clockwise) at this.

In the preferred continuous operation mode, liquid measurement sample is pumped continuously, and measurement sample 10 currently present in the measurement cell 2a is continuously measured (i.e. during the time of an NMR experiment, and typically also between subsequent NMR experiments, measurement sample 10 flows through the measurement cell 2a without interruption). At the same time, a constant gas flow of pH2 bubbles from the gas pressure reservoir 9b through the connection 9 for increasing the gas pressure into the chamber 4 and through the liquid measurement sample 10 present there. Excessive pH2 escapes through the connection 8 for releasing the gas pressure. By means of the facility 7 for generation of an alternating magnetic field, spin transfer from pH2 to the compound in the measurement sample 10 is assisted; the facility 7 is in permanent operation mode for this purpose.

Alternatively, the device 64 can be operated in a discontinuous operation mode. In this case, after having transported a certain part (portion) of the liquid measurement sample 10 (typically enough to refill the measurement cell 2a), the transport of liquid is interrupted for the duration of an NMR measurement. Thereto the valve 66 in (here) the second tube 14 can be closed, such that a stable condition is achieved in the NMR probehead 2. The feeding of pH2 into the chamber 4 and the operation of the facility 7 can be sustained persistently. However, it is also possible to have an interval operation for the pH2 feeding and/or the operation of the activation device (facility) 7, typically with a push-push or a push-pull mode with respect to the transport of the measurement sample 10. For the interval operation, the gas inflow and the gas exhaust for the chamber 4 can be blocked temporarily by means of the valves 9a, 8a. It is further possible, in particular in case of a pH2 feeding in interval operation, to build up a pH2 excess pressure in the chamber 4 temporarily in order to improve the solubility of pH2 in the liquid measurement sample 10.

Explanation of the Concepts of the Inventive Spin Order Transfer

A site of an ordered environment of a template (catalyst, polarisation transfer medium) acts as a broker between a symmetrical molecule (or its halves) and the compound (measurement substance). A site (a location) of the ordered environment first of all allows an arrangement of both the symmetrical molecule and the compound at the site (the location), i.e. it allows a bonding of some kind of the symmetrical molecule and the compound (measurement substance) to the site (the location). The bonding is typically relatively loose, and can be of the coordinative type in particular.

If a symmetrical molecule—that is, its two halves—is arranged at a site of ordered environment, the two halves of the symmetrical molecule become chemically or magnetically distinguishable. In other words, the symmetry of the symmetrical molecule is broken. If a symmetrical molecule (that is, its two halves) and the compound (measurement substance) are arranged at a site of the ordered environment, the site of ordered environment further establishes a coupling of the nuclear spins of the halves of the symmetrical molecules and the compound (that is, its hyperpolarisable nuclei). The coupling mechanism can be, in particular, scalar coupling or dipolar coupling. As a rule, the site of ordered environment causes a close spatial neighbourhood between the spin-carrying atoms of the symmetrical molecule and the hyperpolarisable nuclei of the measurement substance at atomic level.

In the polarisation transfer framework, there is no net chemical reaction. The chemical identity, that is, the total chemical formula and the (spatial) chemical structure, of the compound (measurement substance) is the same both before and after the spin order transfer.

The ordered environment may take the form of a homogeneous or heterogeneous catalyst. For example, a heterogeneous system can include a supported transition metal centre, a microscopic channel in a material (for instance a zeolite, a nanotube or a nanoparticle), a solvent with liquid crystalline properties, or something else which creates a short-range magnetic differentiation in view of the otherwise symmetrical molecule and the compound (measurement substance) to be polarised.

The compound (measurement substance) is typically a molecule, but can also be an ion, a polymer, a nanoparticle, a supramolecular assembly, a peptide, a protein, or something else with a chemical identity.

Examples of combinations of symmetrical molecules, compounds and templates with sites of ordered environment can be found in PCT/EP2008/004865.

To summarise, the invention presented here describes an NMR measurement apparatus with at least one preparation chamber in which, in particular at room temperature, a gas such as para-hydrogen acting as a carrier of non-equilibrium spin order, further a template (catalyst, polarization transfer medium), particularly an iridium-metal complex, and further a compound (measurement substance) present in a liquid measurement sample and containing hyperpolarisable nuclei can be brought together and activated. This allows spin order to be transferred catalytically from the gas to the hyperpolarisable nuclei of the measurement substance without chemical change to the measurement substance. In the NMR experiment, the hyperpolarised nuclei can be measured with increased signal yield, for instance in PH-INEPT experiments. The measurement substance can contain, in particular, H, D, $^{29}$Si, $^{13}$C, $^{15}$N, $^{31}$P or $^{19}$F as hyperpolarisable nuclei, and, in particular, N, NH, S, P or O as electron donors for the attachment to the template. As well as the preparation chamber, the NMR apparatus also includes a flow-through NMR probehead, into which the activated measurement substance is transported using pressurised gas or a pump. The substance is measured in the probehead and then transported back to either the same chamber or to another one, which can either be a preparation chamber or simply an equalisation chamber. Once it has been transported from the probehead to a chamber, the measurement substance can once again—and without having to be removed from the NMR measurement apparatus—be activated with the gas ($pH_2$) and, using pressurised gas or a pump, be returned to the probehead, allowing further measurements of the activated measurement substance. The measurement apparatus has in this respect one or more connections for increasing and releasing the gas pressure, which allow the back-and-forth transport of the liquid measurement sample between the probehead and at least one chamber using pressurised gas; alternatively, the back-and-forth transport of the liquid measurement sample can also be done with a pump. With the inventive NMR measurement apparatus, the measurement of samples even in quick succession conserves measurement substance, because the measurement sample which has just been measured can quickly be reactivated in the measurement apparatus and does not need to be discarded; further gas ($pH_2$) can also be saved, because the reactivation can take place with unused gas remaining in the apparatus.

We claim:

1. A method for carrying out an NMR experiment with enhanced sensitivity on a compound comprising hyperpolarizable nuclei using a device for repeated preparation of a nuclear spin resonance (NMR) liquid measurement sample in a mixing chamber and for measurement of the sample in a flow-through NMR probehead of an NMR measurement apparatus, the device comprising:
   a mixing chamber having means for mixing the liquid measurement sample, contained in said mixing chamber, with a gas;
   a flow-through NMR probehead;

a first tube and a second tube for supply and removal of the liquid NMR measurement sample from said mixing chamber to and from said flow-through NMR probehead;

a sample inlet for introducing the liquid measurement sample into the device;

at least one connection for introducing the gas, for increasing and for releasing gas pressure in said mixing chamber; and a reservoir structured and dimensioned for storing para-hydrogen, wherein said connection for introducing the gas and for increasing gas pressure leads to said reservoir for para-hydrogen;

the method comprising the steps of:

a) preparing a fluid having a temperature TF, containing spatially symmetric molecules comprising two halves each, with a non-Boltzmann nuclear spin state distribution of the symmetric molecules at this temperature TF, wherein the symmetric molecules are para-hydrogen molecules;

b) providing the compound with a defined chemical identity;

c) providing a template that offers sites of ordered environment for the two halves of one of the symmetric molecules and the compound which can be arranged at each site, wherein the ordered environment distinguishes chemically or magnetically the two halves of one of the symmetric molecules arranged at each site, the ordered environment allowing interaction, via scalar or dipolar coupling, between the two halves of one of the symmetric molecules and the compound arranged at each site;

d) bringing together, in said mixing chamber or in a second chamber, the prepared fluid, the provided compound and the provided template, thereby transferring spin order from the symmetric molecules to the hyperpolarizable nuclei of the compound during a temporary association of the symmetric molecules, the compound, and the template while ultimately keeping the chemical identity of the compound;

e) transporting, following step d), at least part of the compound into the flow-through NMR probehead, via one of the first and the second tubes;

f) performing, following step e), an NMR measurement on the part of the compound present in the flow-through NMR probehead comprising hyperpolarized nuclei prepared in step d); and g) transporting, following step f), the part of the compound present in the flow-through NMR probehead into the mixing chamber or the second chamber of the device, thereby permitting renewed transfer of spin order to the hyperpolarizable nuclei in the part of the compound and renewed NMR measurement of those hyperpolarized nuclei.

2. The method of claim 1, wherein steps e) and g) utilize pressurized gas or a pump.

3. The method of claim 1, wherein step d) is carried out in the mixing chamber and, in step g), the compound is transported into the mixing chamber, steps e), f) and g) thereby taking place continuously and simultaneously for different parts of the compound.

4. The method of claim 1, wherein, following step g), steps e), f) and g) are repeated at least once for a further part of the compound.

5. The method of claim 4, wherein repeated steps e), f) and g) take place continuously and simultaneously for different parts of the compound.

6. The method of claim 1, wherein the compound in the mixing chamber or the second chamber in step d) and/or step g) is subjected to a static magnetic field between 10 µT and 0.5 T.

7. The method of claim 6, wherein the magnetic field is between 0.1 mT and 0.5 T.

8. The method of claim 1, wherein a buffer gas is at least partly used for transporting the compound using pressurized gas.

9. The method of claim 8, wherein the buffer gas is $N_2$ or a noble gas.

* * * * *